(12) United States Patent
Su

(10) Patent No.: US 9,526,195 B2
(45) Date of Patent: Dec. 20, 2016

(54) ULTRATHIN SHIELDING FILM OF HIGH SHIELDING EFFECTIVENESS AND MANUFACTURING METHOD THEREOF

(71) Applicant: GUANGZHOU FANGBANG ELECTRONICS CO., LTD, Guangdong (CN)

(72) Inventor: Zhi Su, Guangzhou (CN)

(73) Assignee: GUANGZHOU FANG BANG ELECTRONICS CO., LTD., Guangzhou (CN)

( * ) Notice: Subject to any disclaimer, the term of this patent is extended or adjusted under 35 U.S.C. 154(b) by 241 days.

(21) Appl. No.: 14/384,245

(22) PCT Filed: Sep. 28, 2012

(86) PCT No.: PCT/CN2012/001325
§ 371 (c)(1),
(2) Date: Sep. 10, 2014

(87) PCT Pub. No.: WO2013/188997
PCT Pub. Date: Dec. 27, 2013

(65) Prior Publication Data
US 2015/0030878 A1    Jan. 29, 2015

(30) Foreign Application Priority Data
Jun. 21, 2012    (CN) .......................... 2012 1 0209214

(51) Int. Cl.
*H05K 9/00* (2006.01)
(52) U.S. Cl.
CPC ...... *H05K 9/0088* (2013.01); *Y10T 428/12736* (2015.01); *Y10T 428/12792* (2015.01);
(Continued)
(58) Field of Classification Search
None
See application file for complete search history.

(56) References Cited

U.S. PATENT DOCUMENTS 4,647,714 A * 3/1987 Goto .................... H05K 9/0003
174/36
7,709,750 B2 * 5/2010 Hashimoto .......... H05K 1/0218
174/255
(Continued)

FOREIGN PATENT DOCUMENTS

CN         1787114 A      6/2006
CN       101486264 A      7/2009
(Continued)

*Primary Examiner* — Robert S Loewe
(74) *Attorney, Agent, or Firm* — Bond, Schoeneck & King, PLLC; William Greener; Jonathan Gray

(57) ABSTRACT

The present application provides an ultrathin shielding film of high shielding effectiveness, comprising two or more solid shielding layers. An electrically-conductive adhesive layer is coated onto the outer surface at one side of the solid shielding layers, and one or more insulation film layers are formed on the outer surface at the other side of the solid shielding layers. A carrier film layer is provided on the outer surface of the insulation film layers. A protective film covers the lower surface of the electrically-conductive adhesive layer. The present application further discloses a manufacturing method of an ultrathin shielding film of high shielding effectiveness. The present application has the following advantages: the two or more ultrathin complete solid shielding layers are provided, which are capable of repeatedly reflecting and adsorbing high-frequency interference signals, and meanwhile, excessive charges are conducted into a ground layer, so that the high shielding effectiveness is realized; tests show that, at a frequency over 300 MHz, the shielding effectiveness can reach 60 dB or more; meanwhile, the ultrathin solid shielding layer is capable of providing great bending performance, so that the requirements of an electronic product for lightness and thinness are met.

11 Claims, 3 Drawing Sheets

(52) U.S. Cl.
CPC ........... Y10T 428/12806 (2015.01); Y10T 428/12847 (2015.01); Y10T 428/12861 (2015.01); Y10T 428/12889 (2015.01); Y10T 428/12896 (2015.01); Y10T 428/12903 (2015.01); Y10T 428/12944 (2015.01); Y10T 428/12951 (2015.01); Y10T 428/24975 (2015.01); Y10T 428/25 (2015.01); Y10T 428/256 (2015.01); Y10T 428/269 (2015.01); Y10T 428/2848 (2015.01); Y10T 428/31511 (2015.04); Y10T 428/31551 (2015.04); Y10T 428/31565 (2015.04); Y10T 428/31576 (2015.04); Y10T 428/31721 (2015.04); Y10T 428/31786 (2015.04); Y10T 428/31797 (2015.04); Y10T 428/31935 (2015.04)

(56) References Cited

U.S. PATENT DOCUMENTS

| | | | | |
|---|---|---|---|---|
| 2007/0196671 | A1* | 8/2007 | Kobayashi | B82Y 25/00 428/447 |
| 2009/0117322 | A1* | 5/2009 | Larsen | B32B 33/00 428/137 |
| 2010/0294559 | A1* | 11/2010 | Izawa | H05K 9/0024 174/378 |
| 2013/0206315 | A1* | 8/2013 | Chung | H05K 9/0088 156/60 |

FOREIGN PATENT DOCUMENTS

| CN | 201332571 Y | 10/2009 |
|---|---|---|
| CN | 101448362 B | 10/2010 |

* cited by examiner

ULTRATHIN SHIELDING FILM OF HIGH SHIELDING EFFECTIVENESS AND MANUFACTURING METHOD THEREOF

FIELD OF THE INVENTION

The present application relates to the field of shielding films applied to flexible circuit boards and rigid-flex circuit boards, and more particularly to ultrathin shielding film of high shielding effectiveness and manufacturing method thereof.

BACKGROUND OF THE INVENTION

As the problem of electromagnetic interference on the interior and exterior of modules caused by the requirements of electronic products for lightness, thinness, shortness and smallness and the high frequency and high speed of a communication system is more and more serious, the electromagnetic shielding becomes inevitable.

Currently, the main anti-electromagnetic interference techniques comprise: the shielding technique, the grounding technique and the filter technique. A circuit board including a flexible circuit board, a rigid board and a rigid-flex circuit board realizes the anti-electromagnetic interference mainly in consideration of the following factors: printing conductive silver paste, adding a metal copper layer or laminating an electromagnetic shielding film. In consideration of flexibility and thickness, the electromagnetic shielding film has better operability and practicability. The electromagnetic shielding film is widely applied to the flexible circuit board and the rigid-flex circuit board.

The existing shielding film mainly has the following structures:

First Structure:

In Chinese Patent Application Publication Number CN101176388A titled "Shielding Film, Shielding Printed Circuit Board, Shielding Flexible Printed Circuit Board, Shielding Film Manufacturing Method and Shielding Printed Circuit Board Manufacturing Method", a shielding film is disclosed. An outmost rigid layer and a flexible secondary outer layer form an insulation layer, a solid metal conductor layer is formed on the flexible layer, and a thermocured electrically conductive adhesive layer is formed on the solid metal conductor layer. Due to the arrangement of the solid metal shielding layer, the shielding film has a higher shielding effectiveness. However, as the frequency is increased, and more particularly when the frequency is over 1 GHz, the shielding effectiveness of the shielding film is largely reduced, and the requirement of the shielding effectiveness of 60 dB or more may not be met. Therefore, to manufacture products with the shielding effectiveness of 60 dB or more demanded, the manufacturers still selects to print a certain thickness of silver paste.

In Chinese Patent Application Publication Number CN101448362B titled "ultrathin shielding film capable of changing circuit impedance, circuit board and manufacturing methods of ultrathin shielding film and circuit board", a three-layer structure of a product is disclosed. An insulation layer is the outmost layer, a metal conductor layer is the second layer, and a thermocured electrically conductive adhesive layer, which is coated onto the metal conductor layer, is the third layer. The key points of the patent application are: the final impedance control is realized by changing the grid size of the metal conductor layer, and meanwhile, the functions of a shielding film are also provided. But the shielding effectiveness of the product with the three-layer structure is equal to that of the above-mentioned shielding film, and the same shortage exists. In addition, in the above-mentioned two patent applications, the shielding function is realized by utilizing a structure that one metal conductor layer is provided and the electrically conductive adhesive layer is coated onto the metal conductor layer, so that the disclosed shielding films merely are general shielding films.

Second Structure:

In Chinese Patent Application Publication Number CN1842245A titled "Electronic Assembly with Conducting Layer, Electrically Conductive Adhesive Film and Manufacturing Method of Electrically Conductive Adhesive Film", a two-layer structure is disclosed. The outmost layer is a metal conductor layer, and the second layer is an electrically conductive adhesive layer. Compared with the first structure, the second structure has the characteristic that the outmost layer does not have an insulation layer and may be directly connected with metal. The shielding structure is: one metal conductor layer is utilized, and then the electrically conductive adhesive layer is coated. Therefore, the shielding effectiveness of the utilized shielding structure is not of essential difference with that of the first structure.

Third Structure:

In Chinese Patent Application Publication Number CN101120627A titled "Electromagnetic-Wave-Shielding Adhesive Film, Manufacturing Method of Adhesive Film and Method for Shielding Adherent from Electromagnetic Wave", a two-layer structure is disclosed. The outmost layer is an insulation layer, and the second layer is an omnibearing electrically conductive adhesive layer. Compared with the first and second structures, the third structure has the characteristics that the structure, without the solid metal film layer, may meet the requirement for a thinner product, and has better bending resistance and lower cost. However, the most important index of the shielding film is the shielding effectiveness, and the solid shielding metal conductor layer is not provided, so that the shielding effectiveness of the structure cannot be up to 40 dB when the transmission frequency is over 1 GHz.

Fourth Structure:

In Chinese Patent Application Publication Number CN2626193Y titled "Composite Material with High Thermal Conductivity and Electromagnetic Shielding Function", a composite material with two shielding layers is disclosed. However, an electromagnetic shielding layer is in a shape of checkerboard, and a high-thermal-conductivity layer is arranged between the two shielding layers. On one hand, a thermally conductive adhesive contains ground-thermal-conduction particles, so that it cannot conduct charges accumulated in the shielding layers into a ground layer to realize the stable high-frequency signal shielding. On the other hand, a metal conductor layer is in the shape of checkerboard, which is not a solid metal shielding layer structure, so that the very high shielding effectiveness is not realized.

Fifth Structure:

In Chinese Patent Application Publication Number CN1819758A titled "Double Electromagnetic Shielding Film", a double electromagnetic shielding film utilizing austenitic nickel-chromium type stainless steel as a sputtering target material is disclosed, wherein the double electromagnetic shielding film is formed by processing on a plastic surface. Furthermore, the whole production efficiency is very low, and the mass production of a rolled ultrathin shielding film may not be realized.

Sixth Structure:

In Chinese Patent Application Publication Number CN101521985A titled "Shielding Structure and Flexible Printed Circuit Board with the Shielding Structure", a shielding film is disclosed. A one-side flexible copper-clad plate is formed in a coating manner, and then an electrically conductive adhesive is coated onto the metal layer, wherein the thickness of the metal copper layer is in the range of 1-6 microns, and the thickness of polyimide is in the range of 3-10 microns. The thickness of the metal layer is larger than 1 micron, so that it is far higher than the thickness of a metal shielding layer in the current market. The rigidity is largely increased, so that the flexibility requirement is not met. Meanwhile, a metal foil of the shielding film with the sixth structure needs a carrier support so that the technique is complex, the cost is high, and no market competitiveness exists.

Seventh Structure:

In Chinese Patent Application Publication Number CN101772996A titled "Shielding Film Applied to Printed Wiring Board and Printed Wiring Board", a shielding film is disclosed. The shielding film applied to the printed wiring board and the printed wiring board, in which a metal layer is hard to break when being subjected to repeated sliding and bending from a large bending radius to a small bending radius, are obtained. A first metal layer is a layer formed by one or more scale-like metal particles, and the second metal layer is a porous layer with multiple holes. Therefore, the shielding film with the seventh structure is hard to realize ultrahigh shielding effectiveness.

The above-mentioned structures are: a structure of a complete metal conductor layer coated with the electrically conductive adhesive, or a structure of an omnibearing electrically conductive adhesive, or a thermally conductive structure with two grid metal conductor layers without a solid metal conductor layer and a grounding design. Therefore, according to the above-mentioned structures, the shielding effectiveness of 60 dB or more cannot be reached, or the bending performance cannot be met, or the peel strength cannot be met, or the anti-oxidization performance cannot be met, or the large-scale production of ultrathin rolled products cannot be realized.

SUMMARY OF THE INVENTION

A purpose of the present application is to provide an ultrathin shielding film of high shielding effectiveness, which has good anti-interference performance, and may provide excellent bending performance and meet the requirements of electronic products of lightness and thinness, so as to overcome the deficiency of the prior art.

Another purpose of the present application is to provide a manufacturing method of an ultrathin shielding film of high shielding effectiveness.

The present application is realized by the following: an ultrathin shielding film of high shielding effectiveness comprises two or more solid shielding layers.

The solid shielding layers are sequentially formed on a surface layer by layer.

At least two solid shielding layers are made from different materials.

An electrically conductive adhesive layer is formed on the outer surface at one side of the outmost solid shielding layer, and an insulation film layer is formed on the outer surface at one side of the outmost solid shielding layer.

The insulation film layer may be various insulation film layers or various resin layers, or may be composited by coating different resin according to requirements.

A carrier film layer covers the outer surface of the insulation film layer, and a protective film may be formed on the outer surface of the electrically conductive adhesive layer according to requirements.

The insulation film layer consists of a first insulation film layer and a second insulation film layer which are connected together, and the thickness of the insulation film layer is in the range of 3-25 microns. Wherein the first insulation film layer is made from PPS (polyphenylene sulfite), PEN (polyethylene naphthalate), polyester or polyimide film; the second insulation film layer is coated epoxy resin, polyurethane type resin, acrylic resin or polyimide resin.

The solid shielding layers are made from aluminum, titanium, zinc, iron, nickel, chromium, cobalt, copper, silver or gold, or a metal alloy including more than one of the above-mentioned metals, which includes, but not limited to nichrome, copper nickel alloy, titanium-manganese alloy, nickel-chromium stainless steel and the like. In addition, the solid shielding layers are made from ferrite, carbon nanotube and the like. The thickness of each solid shielding layer is in the range of 0.01-0.5 micron. In consideration of bending requirement, the thickness preferably is selected in a range of 0.01-0.2 micron.

An adhesive in the electrically conductive adhesive layer is PS (polystyrene) type, vinyl acetate type, polyester type, polyethylene type, polyamide type, rubber type, acrylic ester type thermoplastic resin, or phenolic aldehyde type, epoxy type, carbamic acid ester type, melamine type or alcohol acid type thermocuring resin; conductive particles may be carbon, silver, nickel, copper particles, nickel-gold, copper-nickel, copper-silver, nickel-silver, nickel-gold, silver-coated glass or copper-nickel-gold particles or carbon nanotubes, and the weight ratio of the conductive particles to the adhesive is in the range of 10-400%; according to practical requirements, the thickness of the electrically conductive adhesive layer preferably is in the range of 3-20 microns, and the weight ratio preferably is 10-100%. In consideration of reliability and cost, the conductive particles preferably is selected from silver-coated copper particles, nickel-coated copper particles, silver particles, copper particles and nickel particles; the adhesive preferably is high-temperature-resistance epoxy resin or acrylic resin with thermocuring performance; the curing conditions comprise: the temperature is in the range of 80-150° C., and the time is in the range of 20-1 minute. The protective film is a polyester protective film, which has the low cost and may resist a certain temperature, and may also be a polyester silica gel protective film. The thickness of the protective film is in the range of 25-125 microns.

A manufacturing method of an ultrathin shielding film of high shielding effectiveness comprises the following manufacturing steps:

(1) Forming an insulation film layer on a carrier film layer;

(2) Forming a first solid shielding layer on the insulation film layer;

(3) Forming at least one solid shielding layer on the upper surface of the first solid shielding layer;

(4) Forming an electrically conductive adhesive layer on the outer surface of the outmost solid shielding layer.

The above operating steps may be carried out sequentially, and may also be carried out in the following order of second manufacturing method:

A manufacturing method of an ultrathin shielding film of high shielding effectiveness comprises the following manufacturing steps:

(1) Forming two or more peelable solid shielding layers according to requirements;

(2) Forming an insulation film layer on the outer surface at one side of the solid shielding layers;

(3) Forming a required electrically conductive adhesive layer on the outer surface at the other side of the solid shielding layers.

A protective film is formed on the outer surface of the electrically conductive adhesive layer according to requirements.

The shielding films formed by the above-mentioned two manufacturing methods have the same structures but different manufacturing techniques.

Wherein the insulation film layer is made from PPS, PEN, polyester and polyimide film; or it is made from coated modified epoxy resin, polyurethane type resin, modified acrylic resin, or polyimide resin; or it is composited by coating different resins onto an insulation film as required; The thickness of the insulation film layer is in the range of 3-25 microns, preferably 3-7 microns, so that the sufficient flexibility and dielectric strength are ensured. Two or more solid shielding layers are provided with different electromagnetic shielding interferences, thereby realizing the high-efficiency shielding on high frequency and high speed interference signals by carrying out repeated reflection and absorption on the interference signals. The solid shielding layers are electrically connected with a circuit board through an electrically conductive adhesive, so that charges formed by the interference signals may be grounded successfully, and the high-efficiency shielding is realized.

Compared with the prior art, the present application has the following advantages: by providing two or more ultrathin solid shielding layers, high-frequency interference signals may be reflected and absorbed for many times, and meanwhile, surplus charges are conducted into a ground layer, so that the very high shielding effectiveness is realized; based on tests, when the frequency is over 300 MHz, the shielding effectiveness may be over 60 dB; by providing different shielding layers, the high peel strength and oxidation resistance may be realized, and meanwhile, the ultrathin shielding layers may provide excellent bending performance to meet the requirements for light and thin electronic products.

DETAILED DESCRIPTION OF THE EMBODIMENTS

The following is the detailed description of the present application with reference to the accompanying drawings and the specific embodiments.

First Embodiment

Figure 1:
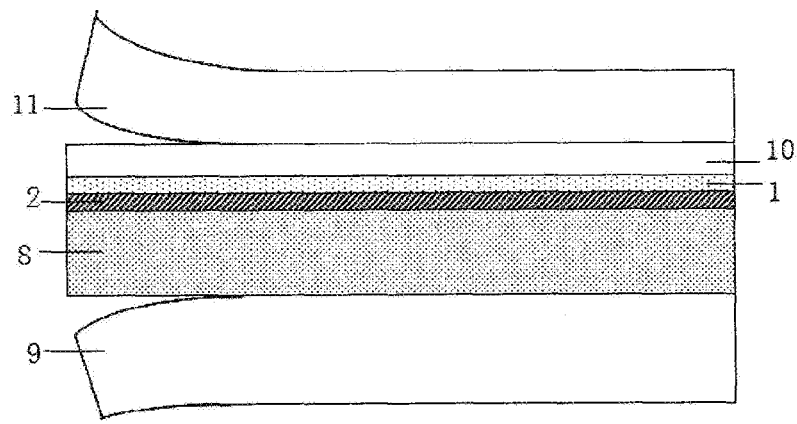
FIG. 1 is a structural block diagram of a profile of an ultrathin shielding film of high shielding effectiveness according to a first embodiment of the present application.

An ultrathin shielding film of high shielding effectiveness, as shown in FIG. 1, comprises two solid shielding layers: a first solid shielding layer 1 and a second solid shielding layer 2. The first solid shielding layer 1 is formed on the surface of the second solid shielding layer 2. An electrically conductive adhesive layer 8 is formed on the outer surface of the second solid shielding layer 2, and an insulation film layer 10 is formed on the outer surface of the first solid shielding layer 1. A carrier film layer 11 covers the upper surface of the insulation film layer 10, and a protective film 9 covers the lower surface of the electrically conductive adhesive layer 8. The carrier film layer 11 supports the insulation film layer 10, which is beneficial to the following processing. The protective film 9 protects the electrically conductive adhesive layer 8, which is also beneficial to the following processing and may prevent from the outside contamination. The first solid shielding layer 1 and the second solid shielding layer 2 are grounded through the electrically conductive adhesive layer 8.

A manufacturing method of an ultrathin shielding film of high shielding effectiveness comprises the following specific manufacturing steps:

(1) Forming an insulation film layer 10 on a carrier film layer 11, wherein the thickness of the insulation film layer is in the range of 3-25 microns; the insulation film layer 10 is made from PPS, PEN, polyester or polyimide film; or it is coated epoxy resin, polyurethane type resin, acrylic resin or polyimide resin. The thickness of the insulation film layer preferably is in the range of 3-8 microns.

(2) Forming a required first solid shielding layer on the insulation film layer. The first solid shielding layer may be made from aluminum, titanium, zinc, iron, nickel, chromium, cobalt, copper, silver, gold, or a metal alloy including more than one of the above-mentioned metals, which includes, but not limited to, nichrome, copper nickel alloy, titanium-manganese alloy, nickel-chromium stainless steel and the like; in addition, the first solid shielding layer may also be made from ferrite, carbon nano-tube and the like. The thickness of the first solid shielding layer is in the range of 0.01-0.5 micron. The first solid shielding layer may be formed by utilizing one or a composite technique of chemical plating, PVD (physical vapor deposition), CVD (chemical vapor deposition), electronic gun evaporation plating, sputtering plating and electroplating. In consideration of bending requirement, the thickness of the first solid shielding layer is preferably in the range of 0.01-0.2 micron.

(3) Forming a required second solid shielding layer 2 on the first solid shielding layer 1. The second solid shielding layer 2 may be made from aluminum, titanium, zinc, iron, nickel, chromium, cobalt, copper, silver, gold and a metal alloy including more than one of the above-mentioned materials, which includes, but not limited to nichrome, copper nickel alloy, titanium-manganese alloy, nickel-chromium stainless steel and the like; it may also be made from ferrite, carbon nano-tube and the like. The thickness of the second solid shielding layer 2 is in the range of 0.01-3 microns. The second solid shielding layer 2 may be formed by utilizing one or a composite technique of chemical plating, PVD, CVD, electronic gun evaporation plating, sputtering plating and electroplating. In consideration of shielding effectiveness, the first solid shielding layer and the second solid shielding layer are made from different shielding materials. The thickness of the second solid shielding layer is preferably in the range of 0.01-1 micron.

(4) Coating an electrically conductive adhesive layer onto the outer surface of the second solid shielding layer 2, and curing it. An adhesive in the electrically conductive adhesive layer is thermoplastic resin of PS (polystyrene) type, vinyl acetate type, polyester type, polyethylene type, polyamide type, rubber type, acrylic ester type and the like, or thermo-curing resin of phenolic aldehyde type, epoxy type, carbamic acid ester type, melamine type or alcohol acid type; conductive particles may be carbon, silver, nickel and copper particles, nickel-gold, copper-nickel, copper-silver, nickel-silver, nickel-gold, silver-coated glass or copper-nickel-gold particles or carbon nano-tubes, and the weight ratio of the conductive particles to the adhesive is in the range of 10-400%; according to practical requirements, preferably the thickness of the electrically conductive adhesive layer is in the range of 5-20 microns, and the weight ratio is 10-100%. In consideration of reliability and cost, the conductive particles preferably are silver-coated copper particles, nickel-coated copper particles, silver particles, copper particles and nickel particles; the adhesive preferably is high-temperature-resistance modified epoxy resin or modified acrylic resin with thermocuring performance; the thickness of the adhesive is in the range of 3-50 microns, and the curing conditions are: the temperature is in the range of 80-150° C., and the time is in the range of 20-1 minute.

(5) Covering a detachable protective film 9 on the electrically conductive adhesive layer 8. The protective film 9 is a polyester protective film, which has the low cost and may resist a certain temperature, and may also be a polyester silica gel protective film. The thickness of the protective film 9 is in the range of 25-125 microns.

Second Embodiment

Figure 2:
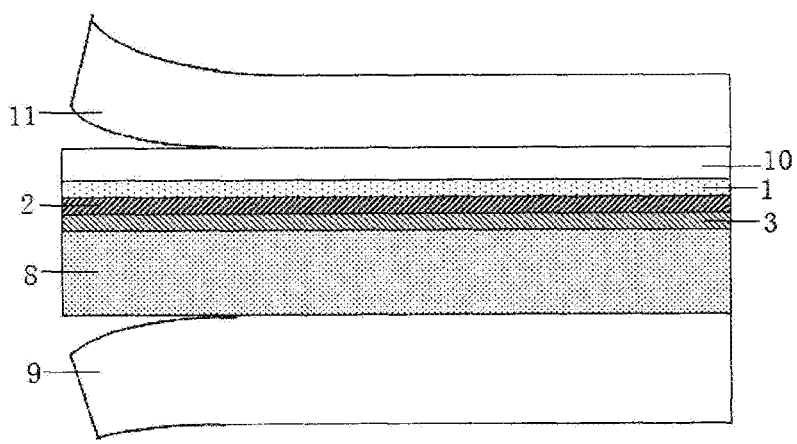
FIG. 2 is a structural block diagram of a profile of an ultrathin shielding film of high shielding effectiveness according to a second embodiment of the present application.

An ultrathin shielding film of high shielding effectiveness, as shown in FIG. 2, comprises three solid shielding layers: a first solid shielding layer 1, a second solid shielding layer 2 and a third solid shielding layer 3. The first solid shielding layer 1, the second solid shielding layer 2 and the third solid shielding layer 3 are formed on the outer surface of a next layer sequentially layer by layer. An electrically conductive adhesive layer 8 is formed on the outer surface of the third solid shielding layer 3, and an insulation film layer 10 is formed on the outer surface of the first solid shielding layer 1. A carrier film layer 11 covers the upper surface of the insulation film layer 10, and a protective film 9 covers the lower surface of the electrically conductive adhesive layer 8. The carrier film layer 11 supports the insulation film layer 10, which is beneficial to the following processing. The protective film 9 protects the electrically conductive adhesive layer 8, which is also beneficial to the following processing and may prevent from the outside contamination. The first solid shielding layer 1, the second solid shielding layer 2 and the third solid shielding layer 3 are grounded through the electrically conductive adhesive layer.

A manufacturing method of an ultrathin shielding film of high shielding effectiveness comprises the following specific manufacturing steps:

(1) Forming an insulation film layer 10 on a carrier film layer 11, wherein the thickness of the insulation film layer 10 is in the range of 3-25 microns; the insulation film layer is made from PPS, PEN, polyester or polyimide film; or it is coated epoxy resin, polyurethane type resin, acrylic resin or polyimide resin. The thickness of the insulation film layer preferably is in the range of 3-8 microns.

(2) Forming a required first solid shielding layer on the insulation film layer 10. The first solid shielding layer may be made from aluminum, titanium, zinc, iron, nickel, chromium, cobalt, copper, silver, gold, or a metal alloy including more than one of the above-mentioned materials, which includes, but not limited to, nichrome, copper nickel alloy, titanium-manganese alloy, nickel-chromium type stainless steel and the like; in addition, the first solid shielding layer may also be made from ferrite, carbon nano-tube and the like. The thickness of the first solid shielding layer is in the range of 0.01-0.5 micron. The first solid shielding layer may be formed by utilizing one or a composite technique of chemical plating, PVD, CVD, electronic gun evaporation plating, sputtering plating and electroplating. In consideration of bending requirement, the thickness of the first solid shielding layer is preferably in the range of 0.01-0.2 micron.

(3) Forming a required second solid shielding layer 2 on the first solid shielding layer 1. The second solid shielding layer may be made from aluminum, titanium, zinc, iron, nickel, chromium, cobalt, copper, silver, gold, or a metal alloy including more than one of the above-mentioned materials, which includes, but not limited to, nichrome, copper nickel alloy, titanium-manganese alloy, nickel-chromium type stainless steel and the like; in addition, the second solid shielding layer may also be made from ferrite, carbon nano-tube and the like. The thickness of the second solid shielding layer 2 is in the range of 0.01-3 microns. The second solid shielding layer is formed by utilizing one or a composite technique of chemical plating, PVD, CVD, electronic gun evaporation plating, sputtering plating and electroplating. The first solid shielding layer 1 and the second solid shielding layer 2 are made from different shielding materials. The thickness of the second solid shielding layer is preferably in the range of 0.01-0.5 micron.

(4) Forming a required third solid shielding layer 3 on the second solid shielding layer 2. The third solid shielding layer 3 is made from aluminum, titanium, zinc, iron, nickel, chromium, cobalt, copper, silver, gold, or a metal alloy including more than one of the above-mentioned materials, which includes, but not limited to, nichrome, copper nickel alloy, titanium-manganese alloy, nickel-chromium type stainless steel and the like; in addition, the third solid shielding layer may also be made from ferrite, carbon nano-tube and the like. The thickness is in the range of 0.01-3 microns. The third solid shielding layer may be formed by utilizing one or a composite technique of chemical plating, PVD, CVD, electronic gun evaporation plating, sputtering plating and electroplating. The second solid shielding layer 2 and the third solid shielding layer 3 may be made from different shielding materials, and may be different in manufacturing technique. The third solid shielding layer 3 may increase the shielding effectiveness, and the thickness of the third solid shielding layer 3 is preferably in the range of 0.01-1 micron.

(5) Coating an electrically conductive adhesive layer 8 onto the outer surface of the third solid shielding layer 3, and curing it. An adhesive in the electrically conductive adhesive layer is thermoplastic resin of PS type, vinyl acetate type, polyester type, polyethylene type, polyamide type, rubber type and acrylic ester type, or thermocuring resin of phenolic aldehyde type, epoxy type, carbamic acid ester type, melamine type or alcohol acid type; conductive particles may be carbon, silver, nickel and copper particles, nickel-gold, copper-nickel, copper-silver, nickel-silver, nickel-gold, silver-coated glass or copper-nickel-gold particles or carbon nano-tubes, and the weight ratio of the conductive particles to the adhesive is in the range of 10-400%; according to practical requirements, preferably the thickness of the electrically conductive adhesive layer is in the range of 5-20 microns, and the weight ratio is 10-100%. In consideration of reliability and cost, the conductive particles are preferably silver-coated copper particles, nickel-coated copper particles, silver particles, copper particles and nickel particles; the adhesive preferably is high-temperature-resistance modified epoxy resin or modified acrylic resin with thermocuring performance; the thickness of the adhesive is in the range of 3-50 microns, and the curing conditions are: the temperature is in the range of 80-150° C., and the time is in the range of 20-1 minute.

(6) Covering a detachable protective film on the electrically conductive adhesive layer 8. The protective film is a polyester protective film, which has the low cost and may resist a certain temperature, and may also be a polyester silica gel protective film. The thickness of the protective film is in the range of 25-125 microns.

Third Embodiment

Figure 3:
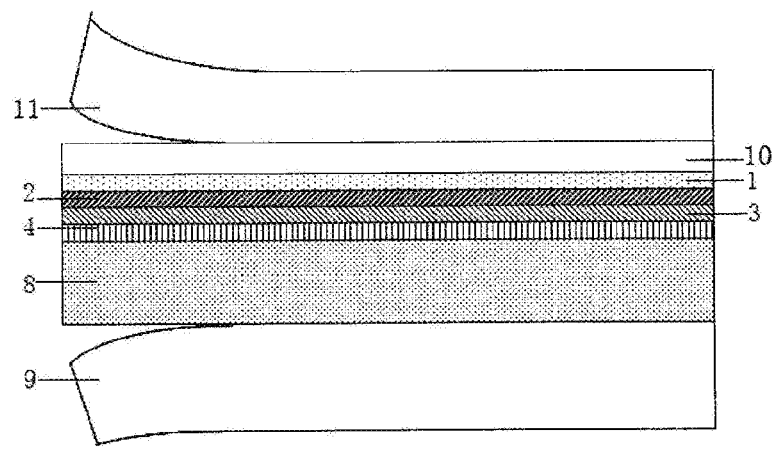
FIG. 3 is a structural block diagram of a profile of an ultrathin shielding film of high shielding effectiveness according to a third embodiment of the present application.

An ultrathin shielding film of high shielding effectiveness, as shown in FIG. 3, comprises four solid shielding layers: a first solid shielding layer 1, a second solid shielding layer 2, a third solid shielding layer 3 and a fourth solid shielding layer 4. Wherein the first solid shielding layer 1, the second solid shielding layer 2, the third solid shielding layer 3 and the fourth solid shielding layer 4 are formed on the outer surface of a next layer sequentially layer by layer. An electrically conductive adhesive layer 8 is formed on the outer surface of the fourth solid shielding layer 4, and an insulation film layer 10 is formed on the outer surface of the first solid shielding layer 1. A carrier film layer 11 covers the upper surface of the insulation film layer 10, and a protective film 9 covers the lower surface of the electrically conductive adhesive layer 8. The carrier film layer 11 supports the insulation film layer 10, which is beneficial to the following processing. The protective film 9 protects the electrically conductive adhesive layer 8, which is also beneficial to the following processing and may prevent from the outside contamination. The four solid shielding layers are grounded through the electrically conductive adhesive layer.

A manufacturing method of an ultrathin shielding film of high shielding effectiveness comprises the following specific manufacturing steps:

(1) Forming an insulation film layer 10 on a carrier film layer 11, wherein the thickness of the insulation film layer 10 is in the range of 3-25 microns; the insulation film layer is made from PPS, PEN, polyester or polyimide film; or the insulation film layer is coated modified epoxy resin, polyurethane type resin, modified acrylic resin or polyimide resin. The thickness of the insulation film layer preferably is in the range of 3-8 microns.

(2) Forming a required first solid shielding layer 1 on the insulation film layer. The first solid shielding layer 1 is made from aluminum, titanium, zinc, iron, nickel, chromium, cobalt, copper, silver, gold, or a metal alloy including more than one of the above-mentioned materials, which includes, but not limited to, nichrome, copper nickel alloy, titanium-manganese alloy, nickel-chromium type stainless steel and the like; in addition, the first solid shielding layer may also be made from ferrite, a carbon nano-tube and the like. The thickness of the first solid shielding layer is in the range of 0.01-0.5 microns. The first solid shielding layer is formed by utilizing one or a composite technique of chemical plating, PVD, CVD, electronic gun evaporation plating, sputtering plating and electroplating. In consideration of bending requirements, the thickness of the first solid shielding layer preferably is in the range of 0.01-0.2 micron.

(3) Forming a required second solid shielding layer 2 on the first solid shielding layer 1. The second solid shielding layer is made from aluminum, titanium, zinc, iron, nickel, chromium, cobalt, copper, silver, gold, or a metal alloy including more than one of the above-mentioned materials, which includes, but not limited to, nichrome, copper nickel alloy, titanium-manganese alloy, nickel-chromium type stainless steel and the like; in addition, the second solid shielding layer may also be made from ferrite, a carbon nano-tube and the like. The thickness of the second solid shielding layer is in the range of 0.01-3 microns. The second solid shielding layer is formed by utilizing one or a composite technique of chemical plating, PVD, CVD, electronic gun evaporation plating, sputtering plating and electroplating. The first solid shielding layer 1 and the second solid shielding layer 2 are made from different shielding materials. The thickness of the second solid shielding layer 2 preferably is in the range of 0.01-0.5 micron.

(4) Forming a required third solid shielding layer 3 on the second solid shielding layer 2. The third solid shielding layer 3 is made from aluminum, titanium, zinc, iron, nickel, chromium, cobalt, copper, silver, gold, or a metal alloy including more than one of the above-mentioned materials, which includes, but not limited to, nichrome, copper nickel alloy, titanium-manganese alloy, nickel-chromium type stainless steel and the like; the third solid shielding layer may also be made from ferrite, a carbon nano-tube and the like. The thickness of the third solid shielding layer is in the range of 0.01-3 microns. The third solid shielding layer is formed by utilizing one or a composite technique of chemical plating, PVD, CVD, electronic gun evaporation plating, sputtering plating and electroplating. The second solid shielding layer and the third solid shielding layer may be made from different shielding materials, and may be different in manufacturing technique. By the third solid shielding layer may, the shielding effectiveness is increased, and the thickness of the third solid shielding layer is preferably in the range of 0.01-1 micron.

(5) Forming a required fourth solid shielding layer 4 on the third solid shielding layer 3. The fourth solid shielding layer 4 is made from aluminum, titanium, zinc, iron, nickel, chromium, cobalt, copper, silver, gold, or a metal alloy including more than one of the above-mentioned materials, which includes, but not limited to, nichrome, copper nickel alloy, titanium-manganese alloy, nickel-chromium type stainless steel and the like; the fourth solid shielding layer may also be made from ferrite, a carbon nano-tube and the like. The thickness of the fourth solid shielding layer is in the range of 0.01-3 microns. The fourth solid shielding layer is formed by utilizing one or a composite technique of chemical plating, PVD, CVD, electronic gun evaporation plating, sputtering plating and electroplating. The fourth solid shielding layer and the third solid shielding layer may be made from different shielding materials, and the fourth solid shielding layer may improve the shielding effectiveness and the anti-oxidization performance. The thickness of the fourth solid shielding layer is preferably in the range of 0.01-1 micron.

(6) Coating an electrically conductive adhesive layer onto the outer surface of the fourth solid shielding layer 4, and curing it. An adhesive in the electrically conductive adhesive layer is thermoplastic resin of PS type, vinyl acetate type, polyester type, polyethylene type, polyamide type, rubber type and acrylic ester type, or thermocuring resin of phenolic aldehyde type, epoxy type, carbamic acid ester type, melamine type or alcohol acid type; conductive particles may be carbon, silver, nickel and copper particles, nickel-gold, copper-nickel, copper-silver, nickel-silver, nickel-gold, silver-coated glass or copper-nickel-gold particles or carbon nano-tubes, and the weight ratio of the conductive particles to the adhesive is in the range of 10-400%; according to practical requirements, preferably the thickness of the electrically conductive adhesive layer is in the range of 5-20 microns, and the weight ratio is 10-100%. In consideration of reliability and cost, the conductive particles preferably are silver-coated copper particles, nickel-coated copper particles, silver particles, copper particles and nickel particles; the adhesive is preferably high-temperature-resistance modified epoxy resin or modified acrylic resin with thermo-curing performance; the thickness of the adhesive is in the range of 3-50 microns, and the curing conditions are: the temperature is in the range of 80-150° C., and the time is in the range of 20-1 minute.

(7) Covering a detachable protective film on the electrically conductive adhesive layer. The protective film is a polyester protective film, which has the low cost and may resist a certain temperature, and may also be a polyester silica gel protective film. The thickness of the protective film is in the range of 25-125 microns.

Fourth Embodiment

Figure 4:
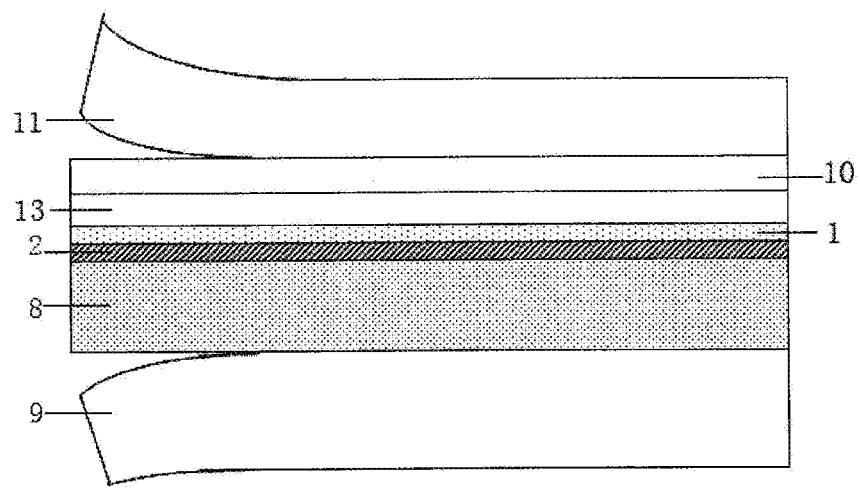
FIG. 4 is a structural block diagram of a profile of an ultrathin shielding film of high shielding effectiveness according to a fourth embodiment of the present application.

An ultrathin shielding film of high shielding effectiveness, as shown in FIG. 4, comprises two solid shielding layers: a first solid shielding layer 1 and a second solid shielding layer 2. The second solid shielding layer 2 is formed on the surface of the first solid shielding layer 1. An electrically conductive adhesive layer 8 is formed on the outer surface of the second solid shielding layer 2, and an insulation film layer 10 is formed on the outer surface of the first solid shielding layer 1. An insulation layer 12 is formed on the outer surface of the insulation film layer 10, a carrier film layer 11 covers the upper surface of the insulation layer 12, and a protective film 9 covers the lower surface of the electrically conductive adhesive layer 8. The carrier film layer 11 supports the insulation film layer 10 and the insulation layer 12, which is beneficial to the following processing. The protective film 9 protects the electrically conductive adhesive layer 8, which is also beneficial to the following processing and may prevent from the outside contamination. The two solid shielding layers are grounded through the electrically conductive adhesive layer 8.

A manufacturing method of an ultrathin shielding film of high shielding effectiveness comprises the following specific manufacturing steps:

(1) Forming a second insulation film layer 12 on a carrier film layer, wherein a first insulation film layer 10 is formed on the second insulation film layer 12, the whole thickness of the second insulation film layer 12 and the first insulation film layer 10 is in the range of 3-25 microns. Wherein the second insulation film layer 12 is made from PPS, PEN, polyester or polyimide film; the first insulation film layer 10 is formed by coating modified epoxy resin, polyurethane type resin, modified acrylic resin or polyimide resin. The second insulation film layer 12 and the first insulation film layer 10 may be exchanged in sequence according to requirements, that means the first insulation film layer 10 is close to the carrier film layer, and the second insulation film layer 12 is formed on the first insulation film layer 10, which is not limited to the structure shown in the FIG. 4. The arrangement of multiple insulation film layers aims at improving the tearing resistance of the insulation film layer during lamination of insulation film layer, and higher-stage lamination requirement is realized. The total thickness of the insulation film layers is preferably in the range of 3-8 microns.

(2) Forming a required first solid shielding layer on the insulation film layer. The first solid shielding layer is made from aluminum, titanium, zinc, iron, nickel, chromium, cobalt, copper, silver, gold, or a metal alloy including more than one of the above-mentioned materials, which includes, but not limited to, nichrome, copper nickel alloy, titanium-manganese alloy, nickel-chromium type stainless steel and the like; the first solid shielding layer may also be made from ferrite, a carbon nano-tube and the like. The thickness of the first solid shielding layer is in the range of 0.01-0.5 micron. The first solid shielding layer is formed by utilizing one or a composite technique of chemical plating, PVD, CVD, electronic gun evaporation plating, sputtering plating and electroplating. In consideration of bending requirements, the thickness of the first solid shielding layer is preferably in the range of 0.01-0.2 micron.

(3) Forming a required second solid shielding layer on the first solid shielding layer. The second solid shielding layer is made from aluminum, titanium, zinc, iron, nickel, chromium, cobalt, copper, silver, gold, or a metal alloy including more than one of the above-mentioned materials, which includes, but not limited to, nichrome, copper nickel alloy, titanium-manganese alloy, nickel-chromium type stainless steel and the like; the second solid shielding layer may also be made from ferrite, a carbon nano-tube and the like. The thickness of the second solid shielding layer is in the range of 0.01-3 microns. The second solid shielding layer is formed by utilizing one or a composite technique of chemical plating, PVD, CVD, electronic gun evaporation plating, sputtering plating and electroplating. In consideration of shielding effectiveness, the first solid shielding layer and the second solid shielding layer are made from different shielding materials. The thickness of the second solid shielding layer is preferably in the range of 0.01-1 micron.

(4) Coating an electrically conductive adhesive layer onto the outer surface of the second solid shielding layer, and curing it. An adhesive in the electrically conductive adhesive layer is thermoplastic resin of PS type, vinyl acetate type, polyester type, polyethylene type, polyamide type, rubber type and acrylic ester type, or thermocuring resin of phenolic aldehyde type, epoxy type, carbamic acid ester type, melamine type or alcohol acid type; conductive particles may be carbon, silver, nickel and copper particles, nickel-gold, copper-nickel, copper-silver, nickel-silver, nickel-gold, silver-coated glass or copper-nickel-gold particles or carbon nano-tubes, and the weight ratio of the conductive particles to the adhesive is in the range of 10-400%; according to practical requirements, preferably the thickness of the electrically conductive adhesive layer is in the range of 5-20 microns, and the weight ratio is 10-100%. In consideration of reliability and cost, the conductive particles preferably are silver-coated copper particles, nickel-coated copper particles, silver particles, copper particles and nickel particles.

Preferably the adhesive is high-temperature-resistance modified epoxy resin or modified acrylic resin with thermocuring performance; the thickness of the adhesive is in the range of 3-50 microns, and the curing conditions are: the temperature is in the range of 80-150° C., and the time is in the range of 20-1 minute.

(5) Covering a detachable protective film on the electrically conductive adhesive layer. The protective film is a polyester protective film, which has the low cost and may resist a certain temperature, and may also be a polyester silica gel protective film. The thickness of the protective film is in the range of 25-125 microns.

Fifth Embodiment

Figure 5:
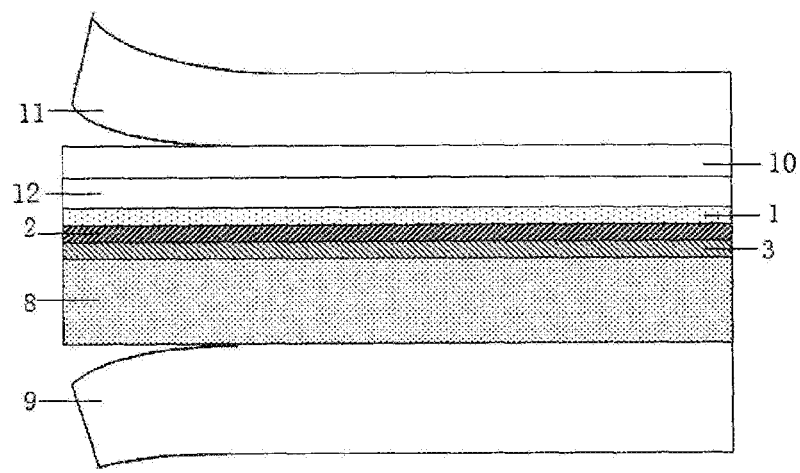
FIG. 5 is a structural block diagram of a profile of an ultrathin shielding film of high shielding effectiveness according to a fifth embodiment of the present application.

An ultrathin shielding film of high shielding effectiveness, as shown in FIG. 5, comprises three solid shielding layers: a first solid shielding layer 1, a second solid shielding layer 2 and a third solid shielding layer 3. The first solid shielding layer 1, the second solid shielding layer 2 and the third solid shielding layer 3 are formed on the outer surface of a next layer sequentially layer by layer. An electrically conductive adhesive layer 8 is formed on the outer surface of the third solid shielding layer 3, and an insulation film layer 10 is formed on the outer surface of the first solid shielding layer 1. An insulation layer 12 is formed on the outer surface of the insulation film layer 10, a carrier film layer 11 covers the upper surface of the insulation layer 12, and a protective film 9 covers the lower surface of the electrically conductive adhesive layer 8. The carrier film layer 11 supports the insulation film layer 10 and the insulation layer 12, which is beneficial to the following processing. The outside contamination may be prevented. The three solid shielding layers are grounded through the electrically conductive adhesive layer.

A manufacturing method of an ultrathin shielding film of high shielding effectiveness comprises the following specific manufacturing steps:

(1) Forming a second insulation film layer 12 on a carrier film layer, wherein a first insulation film layer 10 is formed on the second insulation film layer 12, the whole thickness of the second insulation film layer 12 and the first insulation film layer 10 is in the range of 3-25 microns. The second insulation film layer 12 is made from PPS, PEN, polyester or polyimide film; the first insulation film layer 10 is formed by coating modified epoxy resin, polyurethane type resin, modified acrylic resin or polyimide resin. The second insulation film layer 12 and the first insulation film layer 10 may be exchanged in sequence according to requirements, that means the first insulation film layer 10 is close to the carrier film layer, and the second insulation film layer 12 is formed on the first insulation film layer 10, which is not limited to the structure shown in the FIG. 5. The arrangement of multiple insulation film layers aims at improving the tearing resistance of the insulation film layer during lamination of insulation film layer, and higher-stage lamination requirement is realized. The total thickness of the insulation film layers is preferably in the range of 3-8 microns.

(2) Forming a required first solid shielding layer on the insulation film layers. The first solid shielding layer is made from aluminum, titanium, zinc, iron, nickel, chromium, cobalt, copper, silver, gold, or a metal alloy including more than one of the above-mentioned materials, which includes, but not limited to, nichrome, copper nickel alloy, titanium-manganese alloy, nickel-chromium type stainless steel and the like; the first solid shielding layer may also be made from ferrite, a carbon nano-tube and the like. The thickness of the first solid shielding layer is in the range of 0.01-0.5 micron. The first solid shielding layer may be formed by utilizing one or a composite technique of chemical plating, PVD, CVD, electronic gun evaporation plating, sputtering plating and electroplating. In consideration of bending requirement, the thickness of the first solid shielding layer is preferably in the range of 0.01-0.2 micron.

(3) Forming a required second solid shielding layer on the first solid shielding layer. The second solid shielding layer is made from aluminum, titanium, zinc, iron, nickel, chromium, cobalt, copper, silver, gold, or a metal alloy including more than one of the above-mentioned materials, which includes, but not limited to, nichrome, copper nickel alloy, titanium-manganese alloy, nickel-chromium type stainless steel and the like; the second solid shielding layer may also be made from ferrite, a carbon nano-tube and the like. The thickness of the second solid shielding layer is in the range of 0.01-3 microns. The second solid shielding layer may be formed by utilizing one or a composite technique of chemical plating, PVD, CVD, electronic gun evaporation plating, sputtering plating and electroplating. The first solid shielding layer and the second solid shielding layer are made from different shielding materials. The thickness of the second solid shielding layer is preferably in the range of 0.01-0.5 micron.

(4) Forming a required third solid shielding layer on the second solid shielding layer. The third solid shielding layer is made from aluminum, titanium, zinc, iron, nickel, chromium, cobalt, copper, silver, gold, or a metal alloy including more than one of the above-mentioned materials, which includes, but not limited to, nichrome, copper nickel alloy, titanium-manganese alloy, nickel-chromium type stainless steel and the like; the third solid shielding layer may also be made from ferrite, a carbon nano-tube and the like. The thickness of the third solid shielding layer is in the range of 0.01-3 microns. The third solid shielding layer may be formed by utilizing one or a composite technique of chemical plating, PVD, CVD, electronic gun evaporation plating, sputtering plating and electroplating. The second solid shielding layer and the third solid shielding layer may be made from different shielding materials, and may be different in manufacturing technique. The third solid shielding layer may increase the shielding effectiveness, and the thickness of the third solid shielding layer is preferably in the range of 0.01-1 micron.

(5) Coating an electrically conductive adhesive layer onto the outer surface of the third solid shielding layer, and curing it. An adhesive in the electrically conductive adhesive layer is thermoplastic resin of PS type, vinyl acetate type, polyester type, polyethylene type, polyamide type, rubber type and acrylic ester type, or thermocuring resin of phenolic aldehyde type, epoxy type, carbamic acid ester type, melamine type or alcohol acid type; conductive particles may be carbon, silver, nickel and copper particles, nickel-gold, copper-nickel, copper-silver, nickel-silver, nickel-gold, silver-coated glass or copper-nickel-gold particles or carbon nano-tubes, and the weight ratio of the conductive particles to the adhesive is in the range of 10-400%; according to practical requirements, preferably the thickness of the electrically conductive adhesive layer is in the range of 5-20 microns, and the weight ratio is 10-100%. In consideration of reliability and cost, the conductive particles preferably are silver-coated copper particles, nickel-coated copper particles, silver particles, copper particles and nickel particles. Preferably the adhesive is high-temperature-resistance modified epoxy resin or modified acrylic resin with thermocuring performance; the thickness of the adhesive is in the range of 3-50 microns, and the curing conditions are: the temperature is in the range of 80-150° C., and the time is in the range of 20-1 minute.

(6) Covering a detachable protective film on the electrically conductive adhesive layer. The protective film is a polyester protective film, which has the low cost and may resist a certain temperature, and may also be a polyester silica gel protective film. The thickness of the protective film is in the range of 25-125 microns.

Sixth Embodiment

Figure 6:
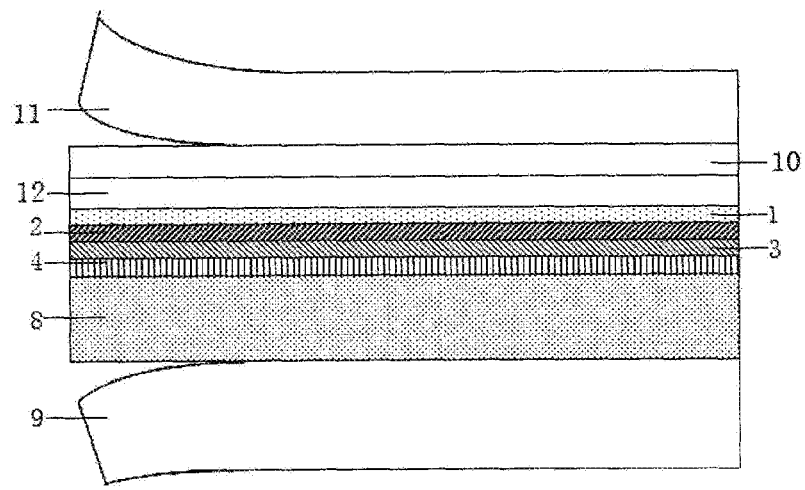
FIG. 6 is a structural block diagram of a profile of an ultrathin shielding film of high shielding effectiveness according to a sixth embodiment of the present application.

An ultrathin shielding film of high shielding effectiveness, as shown in FIG. 6, comprises four solid shielding layers: a first solid shielding layer 1, a second solid shielding layer 2, a third solid shielding layer 3 and a fourth solid shielding layer 4. The first solid shielding layer 1, the second solid shielding layer 2, the third solid shielding layer 3 and the fourth solid shielding layer 4 are formed on the outer surface of a next layer sequentially layer by layer. An electrically conductive adhesive layer 8 is formed on the outer surface of the fourth solid shielding layer 4, and an insulation film layer 12 is formed on the outer surface of the first solid shielding layer 1. An insulation layer 12 is formed on the outer surface of the insulation film layer 10, a carrier film layer 11 covers the upper surface of the insulation layer 12, and a protective film 9 covers the lower surface of the electrically conductive adhesive layer 8. The carrier film layer 11 supports the insulation film layer 10 and the insulation layer 12, which is beneficial to the following processing, and may prevent the outside contamination. The four solid shielding layers are grounded through the electrically conductive adhesive layer.

A manufacturing method of an ultrathin shielding film of high shielding effectiveness comprises the following specific manufacturing steps:

(1) Forming a second insulation film layer 12 on a carrier film layer, wherein a first insulation film layer 10 is formed on the second insulation film layer 12, and the whole thickness of the second insulation film layer 12 and the first insulation film layer 10 is in the range of 3-25 microns. The second insulation film layer 12 is made from PPS, PEN, polyester or polyimide film; the first insulation film layer 10 is formed by coating modified epoxy resin, polyurethane type resin, modified acrylic resin or polyimide resin. The second insulation film layer 12 and the first insulation film layer 10 may be exchanged in sequence according to requirements, that means the first insulation film layer 10 is close to the carrier film layer, and the second insulation film layer 12 is formed on the first insulation film layer 10, which is not limited to the structure shown in the FIG. 6. The arrangement of multiple insulation film layers aims at improving the tearing resistance of the insulation film layer during lamination of insulation film layer, and higher-stage lamination requirement is realized. The total thickness of the insulation film layers is preferably in the range of 3-8 microns.

(2) Forming a required first solid shielding layer on the insulation film layers. The first solid shielding layer is made from aluminum, titanium, zinc, iron, nickel, chromium, cobalt, copper, silver, gold, or a metal alloy including more than one of the above-mentioned materials, which includes, but not limited to, nichrome, copper nickel alloy, titanium-manganese alloy, nickel-chromium type stainless steel and the like; the first solid shielding layer may also be made from ferrite, a carbon nano-tube and the like. The thickness of the first solid shielding layer is in the range of 0.01-0.5 micron.

The first solid shielding layer may be formed by utilizing one or a composite technique of chemical plating, PVD, CVD, electronic gun evaporation plating, sputtering plating and electroplating. For bending requirement considering, the thickness of the first solid shielding layer is preferably in the range of 0.01-0.2 micron.

(3) Forming a required second solid shielding layer on the first solid shielding layer. The second solid shielding layer is made from aluminum, titanium, zinc, iron, nickel, chromium, cobalt, copper, silver, gold, or a metal alloy including more than one of the above-mentioned materials, which includes, but not limited to, nichrome, copper nickel alloy, titanium-manganese alloy, nickel-chromium type stainless steel and the like; the second solid shielding layer may also be made from ferrite, a carbon nano-tube and the like. The thickness of the second solid shielding layer is in the range of 0.01-3 microns. The second solid shielding layer may be formed by utilizing one or a composite technique of chemical plating, PVD, CVD, electronic gun evaporation plating, sputtering plating and electroplating. The first solid shielding layer and the second solid shielding layer are made from different shielding materials. The thickness of the second solid shielding layer is preferably in the range of 0.01-0.5 micron.

(4) Forming a required third solid shielding layer on the second solid shielding layer. The third solid shielding layer is made from aluminum, titanium, zinc, iron, nickel, chromium, cobalt, copper, silver, gold, or a metal alloy including more than one of the above-mentioned materials, which includes, but not limited to, nichrome, copper nickel alloy, titanium-manganese alloy, nickel-chromium type stainless steel and the like; the third solid shielding layer may also be made from ferrite, a carbon nano-tube and the like. The thickness of the third solid shielding layer is in the range of 0.01-3 microns. The third solid shielding layer may be formed by utilizing one or a composite technique of chemical plating, PVD, CVD, electronic gun evaporation plating, sputtering plating and electroplating. The second solid shielding layer and the third solid shielding layer may be made from different shielding materials, and may be different in manufacturing technique. The third solid shielding layer may increase the shielding effectiveness, and the thickness of the third solid shielding layer is preferably in the range of 0.01-1 micron.

(5) Forming a required fourth solid shielding layer on the third solid shielding layer. The fourth solid shielding layer is made from aluminum, titanium, zinc, iron, nickel, chromium, cobalt, copper, silver, gold, or a metal alloy including more than one of the above-mentioned materials, which includes, but not limited to, nichrome, copper nickel alloy, titanium-manganese alloy, nickel-chromium type stainless steel and the like; the fourth solid shielding layer may also be made from ferrite, a carbon nano-tube and the like. The thickness of the fourth solid shielding layer is in the range of 0.01-3 microns. The fourth solid shielding layer may be formed by utilizing one or a composite technique of chemical plating, PVD, CVD, electronic gun evaporation plating, sputtering plating and electroplating. The fourth solid shielding layer and the third solid shielding layer may be made from different shielding materials, the fourth solid shielding layer may improve the shielding effectiveness and the anti-oxidization performance. The thickness of the fourth solid shielding layer is preferably in the range of 0.01-1 micron.

(6) Coating an electrically conductive adhesive layer onto the outer surface of the fourth solid shielding layer, and curing it. An adhesive in the electrically conductive adhesive layer is thermoplastic resin of PS type, vinyl acetate type, polyester type, polyethylene type, polyamide type, rubber type and acrylic ester type, or thermocuring resin of phenolic aldehyde type, epoxy type, carbamic acid ester type, melamine type or alcohol acid type; conductive particles may be carbon, silver, nickel and copper particles, nickel-gold, copper-nickel, copper-silver, nickel-silver, nickel-gold, silver-coated glass or copper-nickel-gold particles or carbon nano-tubes, and the weight ratio of the conductive particles to the adhesive is in the range of 10-400%; according to practical requirements, preferably the thickness of the electrically conductive adhesive layer is in the range of 5-20 microns, and the weight ratio is 10-100%. In consideration of reliability and cost, the conductive particles preferably are silver-coated copper particles, nickel-coated copper particles, silver particles, copper particles and nickel particles. Preferably the adhesive is high-temperature-resistance modified epoxy resin or modified acrylic resin with thermocuring performance; the thickness of the adhesive is in the range of 3-50 microns, and the curing conditions are: the temperature is in the range of 80-150° C., and the time is in the range of 20-1 minute.

(7) Covering a detachable protective film on the electrically conductive adhesive layer. The protective film is a polyester protective film, which has the low cost and may resist a certain temperature, and may also be a polyester silica gel protective film. The thickness of the protective film is in the range of 25-125 microns. Seventh embodiment A manufacturing method of an ultrathin shielding film of high shielding effectiveness comprises the following manufacturing steps:

(1) Forming a bright matrix carrier band;

(2) Sequentially forming two or more required solid shielding layers on the bright matrix carrier band by utilizing an evaporation plating or electrodeposition or chemical deposition technique;

(3) Forming an insulation film layer on the outer surfaces of the solid shielding layers;

(4) Laminating a transferable adhesive film on the insulation film layer, and peeling off the insulation film layer and the solid shielding layers from the bright matrix carrier band;

(5) Forming a required electrically conductive adhesive layer on the outer surface at the other side of the solid shielding layers.

(6) Laminating a protective layer on the electrically conductive adhesive layer according to requirements.

A manufacturing technique for specifically manufacturing two or more solid shielding layers may refer to Chinese Patent Application Publication Number CN101486264 filed in 2009 by the inventor and titled "peelable ultrathin transfer carrier metal foil and manufacturing method thereof".

The above description is just the preferred embodiments of the present application and should not be construed as limitation on the protection scope of the present application Any simple equivalent replacements or modifications, made within the protection scope and description content of the present application, should be included in the protection scope of the present application.

The invention claimed is:

1. An ultrathin shielding film of high shielding effectiveness, comprising:
   two or more solid shielding layers;
   an electrically conductive adhesive layer disposed on the outer surface of one side of the solid shielding layers,
   one or more insulation film layers disposed on the outer surface of the other side of the solid shielding layers; and
   a carrier film layer covering the outer surface of the insulation film layers, and a protective film disposed on the outer surface of the electrically conductive adhesive layer.

2. The ultrathin shielding film of high shielding effectiveness according to claim 1, characterized in that the solid shielding layers are sequentially formed on a surface layer by layer.

3. The ultrathin shielding film of high shielding effectiveness according to claim 2, characterized in that at least two solid shielding layers are made from different materials.

4. The ultrathin shielding film of high shielding effectiveness according to claim 1, characterized in that the one or more insulation film layers consist of a first insulation film layer and a second insulation film layer which are connected together, and the thickness of the whole first insulation film layer and second insulation film layer is 3-25 microns.

5. The ultrathin shielding film of high shielding effectiveness according to claim 4, characterized in that the first insulation film layer is made from PPS (polyphenylene sulfite), PEN (polyethylene naphthalate), polyester or polyimide film; the second insulation film layer is coated epoxy resin, polyurethane type resin, acrylic resin or polyimide resin.

6. The ultrathin shielding film of high shielding effectiveness according to claim 1, characterized in that each solid shielding layer is made from aluminum, titanium, zinc, iron, nickel, chromium, cobalt, copper, silver, gold or a metal alloy including more than one of the above-mentioned metals, or is made from ferrite or carbon nanotubes; the thickness of each solid shielding layer is in the range of 0.01-0.5 micron.

7. The ultrathin shielding film of high shielding effectiveness according to claim 6, characterized in that the thickness of each solid shielding layer is in the range of 0.01-0.2 micron.

8. The ultrathin shielding film of high shielding effectiveness according to claim 1, characterized in that an adhesive in the electrically conductive adhesive layer is thermoplastic resin of PS (polystyrene) type, vinyl acetate type, polyester type, polyethylene type, polyamide type, rubber type or acrylic ester type, or is thermocuring resin of phenolic aldehyde type, epoxy type, carbamic acid ester type, melamine type or alcohol acid type, conductive particles are carbon, silver, nickel, copper particles, nickel-gold, copper-nickel, copper-silver, nickel-silver, nickel-gold, silver-coated glass or copper-nickel-gold particles or carbon nanotubes, and the weight ratio of the conductive particles to the adhesive is in the range of 10-400%; the thickness of the adhesive is in the range of 3-50 microns.

9. The ultrathin shielding film of high shielding effectiveness according to claim 1, characterized in that the thickness of the electrically conductive adhesive layer is in the range of 5-20 microns, and the weight ratio of the conductive particles to the adhesive is in the range of 10-100%; the conductive particles are silver-coated copper particles, nickel-coated copper particles, silver particles, copper particles or nickel particles.

10. A manufacturing method of an ultrathin shielding film of high shielding effectiveness according to any one of claim 1, comprising the following steps:

(1) forming an insulation film layer on a carrier film layer;

(2) forming a first solid shielding layer on the insulation film layer;

(3) forming at least one solid shielding layer on the upper surface of the first solid shielding layer;
(4) forming an electrically conductive adhesive layer on the outer surface of the outmost solid shielding layer.

11. A manufacturing method of an ultrathin shielding film of high shielding effectiveness according to any one of claim 1, comprising the following steps:
(1) forming two or more peelable solid shielding layers;
(2) forming an insulation film layer on the outer surface at one side of the solid shielding layers;
(3) forming a required electrically conductive adhesive layer on the outer surface at the other side of the solid shielding layers.

* * * * *